US007056849B2

(12) United States Patent
Wan et al.

(10) Patent No.: US 7,056,849 B2
(45) Date of Patent: Jun. 6, 2006

(54) NANOSCALE ORDERED COMPOSITES OF COVALENT CERAMICS FOR HIGH-TEMPERATURE STRUCTURAL APPLICATIONS VIA BLOCK-COPOLYMER-ASSISTED ASSEMBLY AND METHOD OF MAKING

(75) Inventors: Julin Wan, Schenectady, NY (US); Azar Alizadeh, Wilton, NY (US); Sergio Paulo Martins Loureiro, Saratoga Springs, NY (US); Mohan Manoharan, Niskayuna, NY (US); Patrick Roland Lucien Malenfant, Clifton Park, NY (US); Eric James Crane Olson, Niskayuna, NY (US); Seth Thomas Taylor, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 30 days.

(21) Appl. No.: 10/761,076

(22) Filed: Jan. 16, 2004

(65) Prior Publication Data

US 2005/0159293 A1 Jul. 21, 2005

(51) Int. Cl.
*C04B 35/524* (2006.01)
*C04B 35/571* (2006.01)
*C04B 35/589* (2006.01)

(52) U.S. Cl. .......................... 501/87; 501/88; 501/92; 501/97.1; 501/97.4; 501/96.4; 977/DIG. 1

(58) Field of Classification Search ............ 501/88–92, 501/87, 97.1, 97.4, 96.4; 977/DIG. 1
See application file for complete search history.

(56) References Cited

U.S. PATENT DOCUMENTS

| 6,270,846 | B1 | | 8/2001 | Brinker et al. |
| 6,277,774 | B1 | * | 8/2001 | Xiao et al. ..................... 501/12 |
| 6,287,714 | B1 | * | 9/2001 | Xiao et al. ................... 428/698 |
| 6,478,994 | B1 | * | 11/2002 | Sneddon et al. .............. 264/43 |
| 6,541,539 | B1 | | 4/2003 | Yang et al. |
| 6,592,991 | B1 | * | 7/2003 | Wiesner et al. ............. 428/404 |
| 6,676,887 | B1 | * | 1/2004 | Lafdi ......................... 264/683 |
| 6,960,327 | B1 | * | 11/2005 | Navrotsky et al. .......... 423/130 |

OTHER PUBLICATIONS

Christopher Viney, "*Processing and Microstructural Control: Lessons From Natural Materials*", Materials Science and Engineering, vol. 10, pp. 187-236, 1993.

(Continued)

*Primary Examiner*—Karl Group
(74) *Attorney, Agent, or Firm*—Paul J. DiConza; William E. Powell, III

(57) ABSTRACT

A method of making nanoscale ordered composites of covalent ceramics through block copolymer-assisted assembly. At least one polymeric precursor is mixed with a block copolymer, and self-assembly of the mixture proceeds through an annealing process. During the annealing step, the polymeric precursor cross-links to form a structure robust enough to survive both the order-disorder transition temperature the block copolymer and the pyrolysis process, yielding ordered nanocomposites of high temperature ceramic materials. The method yields a variety of structures and morphologies. A ceramic material having at least one ceramic phase that has an ordered structure on a nanoscale and thermally stable up to a temperature of at least about 800° C. is also disclosed. The ceramic material is suitable for use in hot gas path assemblies, such as turbine assemblies, boilers, combustors, and the like.

28 Claims, 5 Drawing Sheets

OTHER PUBLICATIONS

Michael Rubner, "*Synthetic Sea Shell*", Nature Publishing Group, vol. 423, pp. 925-926, Jun. 26, 2003.

Shu Yang et al., "*Ordered Hydrophobic Organosilicates Templated By Block Copolymers*", Chem. Mater., vol. 14, pp. 5173-5178, 2002.

Kersten M. Forsthoefel et al., *Chemical Precursor routes to Nanostructured Non-Oxide Ceramics*, Mat. Res. Soc. Symp. Proc., vol. 728, p. 53 and pp. 60-64, 2002.

Li-Anne Liew et al., "*Fabrication of SiCN Ceramic MEMS Using Injectable Polymer-Precursor Technique*", Elsevier, Sensors and Actuators A, vol. 89, pp. 64-70, 2001.

Tomasz Kowalewski et al., "*Nanostructured Carbon Arrays From Block Copolymers of Polyacrylonitrile*", J. Am. Chem. Soc. vol. 124, No. 36, pp. 10632-10633.

Zhiyong Tang et al., "*Nanostructured Artificial Nacre*", Nature Materials, vol. 2, pp. 413-418, Jun. 2003.

Monnier et al., "Cooperative Formation of Inorganic—Organic Interfaces in the Synthesis of Silicate Microstructures," *Science*, vol. 261, pp. 1299-1303, Sep. 3, 1993.

Templin et al., "Organically Modified Aluminosilicate Mesostructures from Block Copolymer Synthesis," *Science*, Vo. 278, pp. 1795-1798, Dec. 5, 1997.

\* cited by examiner

202

NANOSCALE ORDERED COMPOSITES OF COVALENT CERAMICS FOR HIGH-TEMPERATURE STRUCTURAL APPLICATIONS VIA BLOCK-COPOLYMER-ASSISTED ASSEMBLY AND METHOD OF MAKING

BACKGROUND OF INVENTION

The invention relates to ceramic materials. More particularly, the invention relates to nanoscale ordered composites of covalent ceramic materials through block copolymer assisted assembly.

Composite materials having long-range order exist in nature. Natural composites, such as seashells, exhibit extraordinary mechanical properties that stem from the unique hierarchically-ordered structure in these materials. This realization has consequently triggered an effort to mimic nature by building long-range ordered structures at the nanoscale level. Order on the nanoscale can be used in turn to create hierarchically ordered structures on micron and millimeter scales.

The technology to produce nanoscale inorganic ordered structures includes "top-down" approaches, such as sequential deposition and nanolithography, and "bottom-up" approaches, such as self-assembly based on ionic and nonionic surfactants and block copolymers. Inorganic ceramic materials, such as silica and oxides having nanoscale order have been obtained by self-assembly using organic species as structure-directing agents. Polymeric precursors have been used to develop nanotubes and nanofibers of boron nitride, boron carbide, and silicon carbide, and to fabricate high temperature MEMS with dimensions in the micron to sub-millimeter range. Block copolymers have been used to fabricate nanostructured arrays of carbon.

Current synthetic techniques such as self-assembly approach have not yielded hierarchically-ordered non-oxide ceramic materials for high temperature applications. Therefore, what is needed are hierarchically-ordered non-oxide ceramic materials that are stable at high temperatures. What is also needed is a block polymer assisted assembly method of making such hierarchically-ordered non-oxide ceramic materials that are stable at high temperatures.

BRIEF SUMMARY OF INVENTION

The present invention meets these and other needs by providing a method of making nanoscale ordered composites of covalent ceramics through block copolymer assisted assembly. The present invention also provides ceramic materials having nanoscale ordered structures that are thermally stable up to high temperatures. At least one polymeric precursor is mixed with a block copolymer, and self-assembly of the mixture proceeds through an annealing process. During the annealing step, the polymeric precursors cross-link to form a structure that is robust enough to survive the order-disorder transition (also referred to hereinafter as "ODT") temperature of both the block copolymer and the pyrolysis process, leading to ordered nanocomposites of high temperature ceramic materials. Voids left behind by decomposition of the block copolymer can be closed during the pyrolysis to form nonporous dense material. The method yields a variety of structures and morphologies.

Accordingly, one aspect of the invention is to provide a ceramic material. The ceramic material comprises at least one ceramic phase, wherein the at least one ceramic phase has an ordered structure on a nanoscale, and wherein the ordered structure is thermally stable up to a temperature of at least about 800° C.

Another aspect of the invention is to provide a ceramic material. The ceramic material comprises at least one ceramic phase, wherein the at least one ceramic phase has an ordered structure on a nanoscale, and wherein the ordered structure is thermally stable up to a temperature of at least about 800° C. The ceramic material is formed by: forming a homogenized mixture of at least one polymeric precursor of the at least one ceramic phase and at least one block copolymer; forming the ordered structure by curing the at least one polymeric precursor and self-assembly of the at least one block copolymer; pyrolyzing the at least one polymeric precursor and the at least one block copolymer to remove the block copolymer; and converting the at least one polymeric precursor to form the at least one ceramic phase, wherein the at least one ceramic phase has an ordered structure.

Yet another aspect of the invention is to provide a ceramic material. The ceramic material comprises at least one ceramic phase. The at least one ceramic phase comprises one of an oxide, a carbide, a nitride, a boride, and combinations thereof, and has an ordered structure on a nanoscale, wherein the ordered structure is thermally stable up to a temperature of at least about 800° C. The at least one ceramic phase is formed by: forming a homogenized mixture of at least one polymeric precursor of the at least one ceramic phase and at least one block copolymer; forming the ordered structure by curing the at least one polymeric precursor and self-assembly of the at least one block copolymer; pyrolyzing the at least one polymeric precursor and the at least one block copolymer to remove the block copolymer; and converting the at least one polymeric precursor to form the at least one ceramic phase, wherein the at least one ceramic phase has an ordered structure.

Another aspect of the invention is to provide a method of making a ceramic material. The ceramic material comprises at least one ceramic phase having an ordered structure on a nanoscale, wherein the ordered structure is thermally stable up to a temperature of at least about 800° C. The method comprises the steps of: providing at least one polymeric precursor for the at least one ceramic phase and at least one block copolymer; forming a homogenized mixture of the at least one polymeric precursor and the at least one block copolymer; forming an ordered structure by curing the at least one polymeric precursor and self-assembly of the at least one block copolymer; pyrolyzing the at least one polymeric precursor and the at least one block copolymer to decompose at least a portion of the at least one block copolymer; and converting the at least one polymeric precursor to form the at least one ceramic phase, the at least one ceramic phase having an ordered structure.

Another aspect of the invention is to provide a method of making an article comprising at least one ceramic phase having an ordered structure on a nanoscale, wherein the ordered structure is thermally stable up to a temperature of at least about 800° C. The method comprises the steps of: providing at least one polymeric precursor for the at least one ceramic phase and at least one block copolymer; forming a homogenized mixture of the at least one polymeric precursor and the at least one block copolymer; casting the homogenized mixture into a preform of the article; forming an ordered structure by curing the at least one polymeric precursor and self-assembly of the at least one block copolymer in the preform; pyrolyzing the preform to decompose at least a portion of the at least one block copolymer; and converting the at least one polymeric precursor in the preform to form the article comprising the at least one ceramic phase having an ordered structure.

These and other aspects, advantages, and salient features of the present invention will become apparent from the following detailed description, the accompanying drawings, and the appended claims.

DETAILED DESCRIPTION

Figure 1:
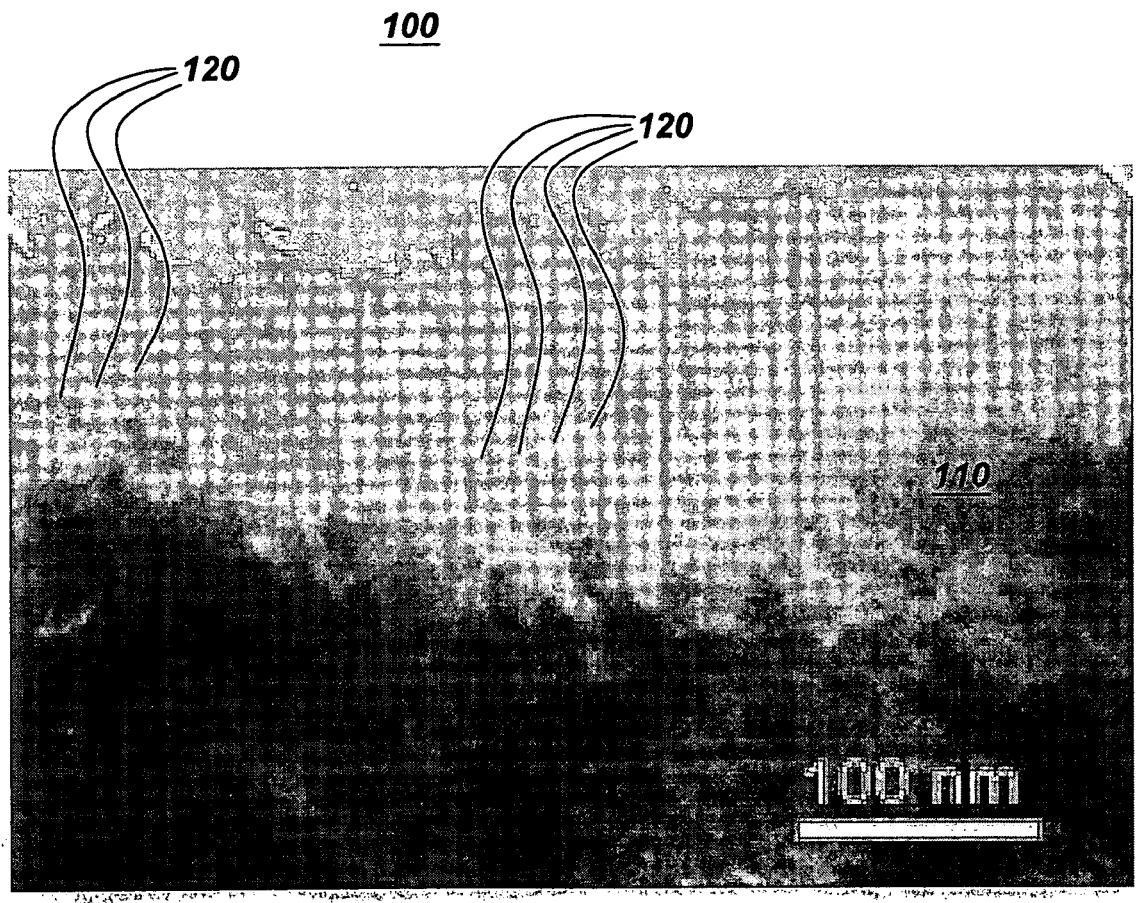
FIG. 1 is a transmission electron microscopy (TEM) image of a C/Si—C—N(—O) nanocomposite.
Figure 2:
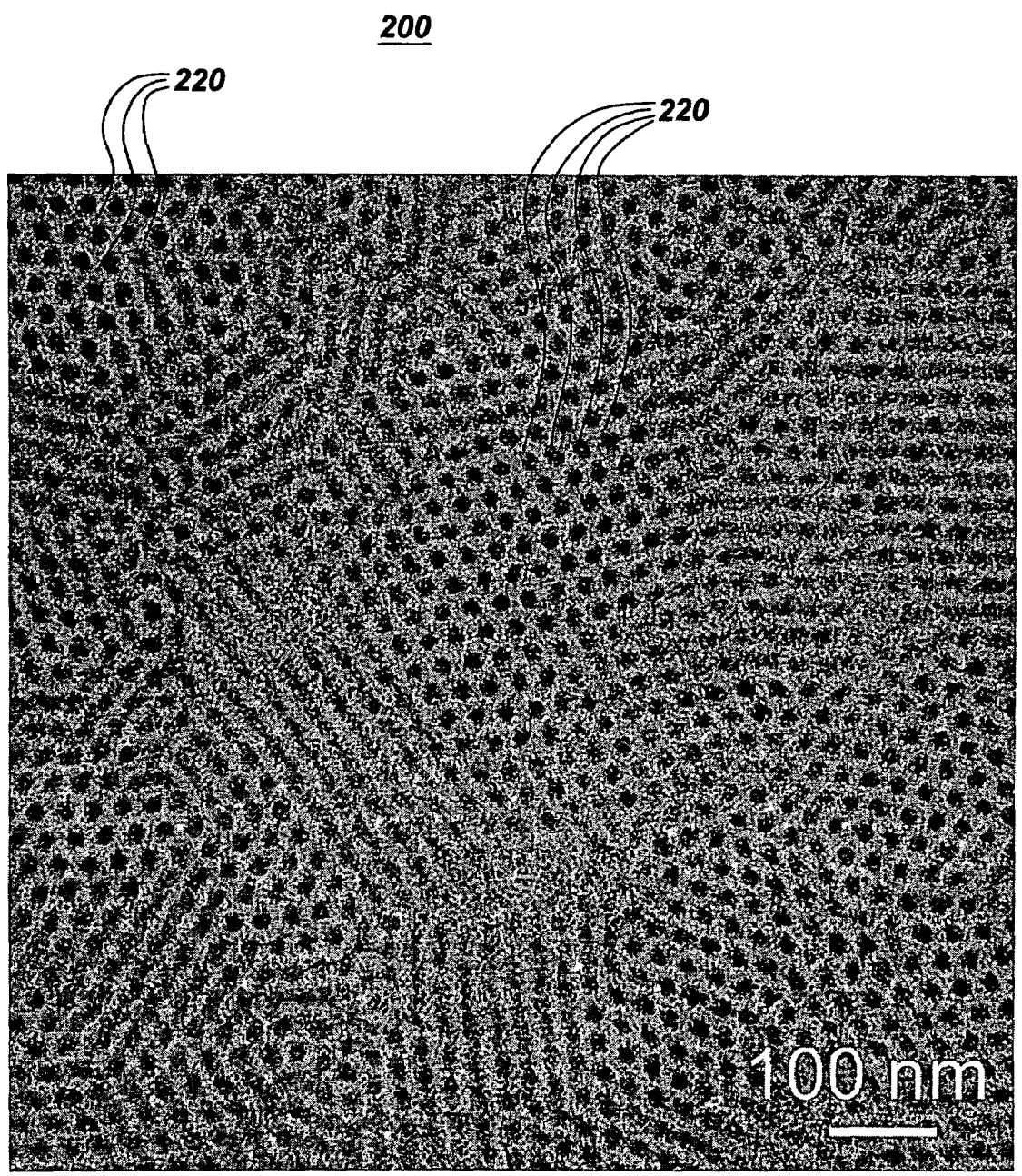
FIG. 2 is a TEM image of a self-assembled poly(butadiene)-b-poly(ethylene oxide) polymer (PB-b-PEO)/polysilazane blend, having a block copolymer (BCP):precursor ratio of 63:37 by weight, after self-assembly at 100° C. for 12 hours and cross-linking at 100° C. for 2 hours.
Figure 3:
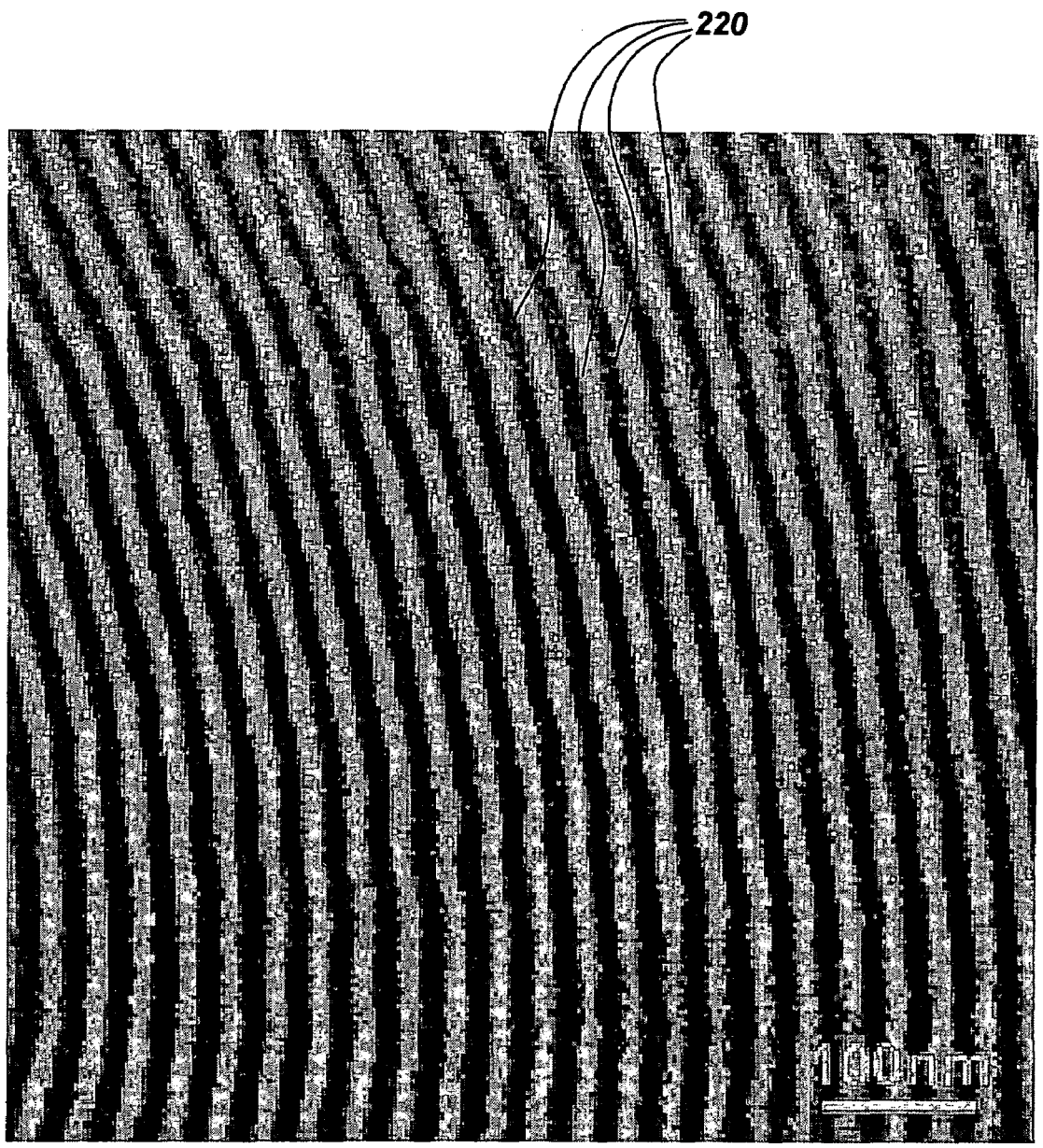
FIG. 3 is a TEM image of a self-assembled PB-b-PEO/polysilazane blend, having a BCP:precursor ratio of 56:44 by weight, after self-assembly at 100° C. for 12 hours.
Figure 4:
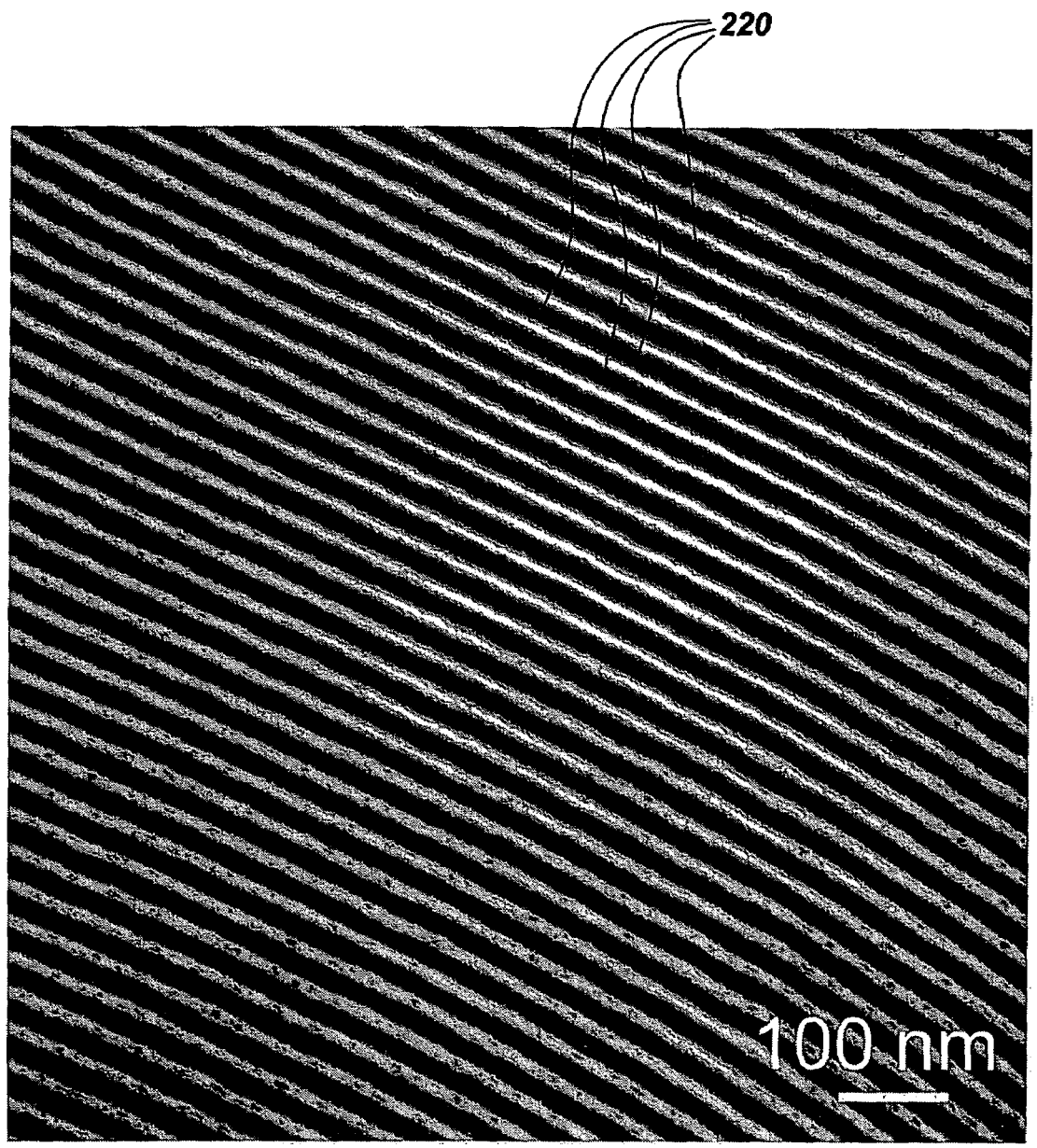
FIG. 4 is a TEM image of a self-assembled PB-b-PEO/polysilazane blend, having a BCP:precursor ratio of 38:62 by weight, after self-assembly at 100° C. for 12 hours.
Figure 5:
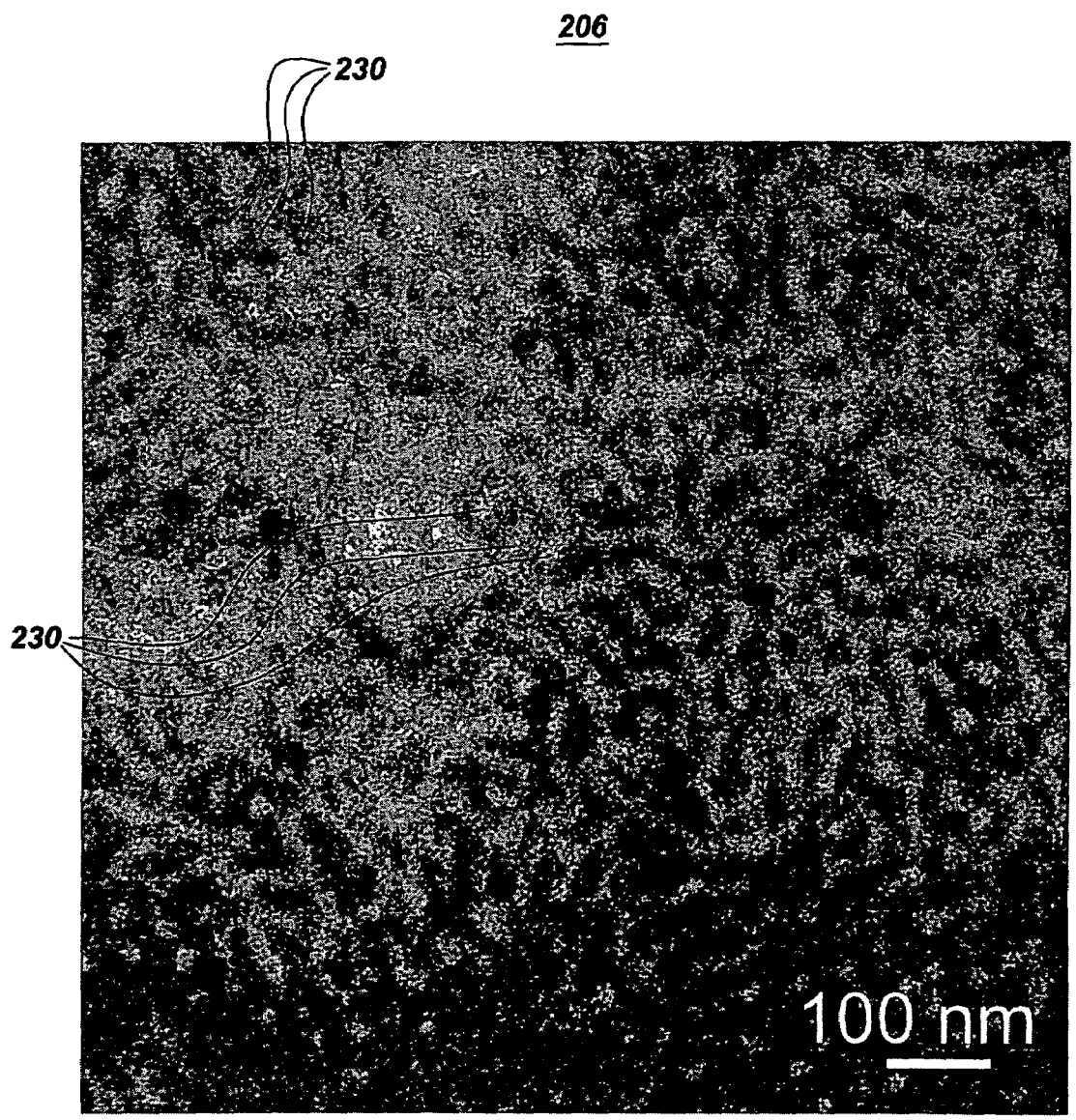
FIG. 5 is a TEM image of a self-assembled PB-b-PEO/polysilazane blend, having a ratio of 17:83 by weight, after self-assembly at 100° C. for 12 hours.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto.

A ceramic material of the present invention is shown in FIG. 1. FIG. 1 is a transmission electron microscopy (TEM) image of a C/Si—C—N(—O) nanocomposite of the present invention. The ceramic material 100 comprises at least one ceramic phase 110. The at least one ceramic phase 110 has an ordered structure 120 on a nanoscale. Ordered structure 120 is thermally stable up to a temperature of at least about 800° C. The ceramic material 100 shown in FIG. 1, for example, retained its ordered structure 112 after having been heated to about 800° C. In one embodiment, ordered structure 120 is thermally stable at temperatures in a range from about 800° C. to about 1800° C. In a preferred embodiment, ordered structure 120 is thermally at temperatures in a range from about 1200° C. to about 1500° C.

The at least one ceramic phase 110 comprises one of an oxide, a carbide, a nitride, a boride, and combinations thereof. In one embodiment, the at least one ceramic phase 110 comprises at least one of silicon carbide, silicon nitride, silicon carbonitride, silicon oxynitride, silicon boron carbonitride, boron nitride, boron carbide, boron carbonitride, and combinations thereof.

Individual regions of the at least one ceramic phase 110 comprise an ordered structure 120. Ordered structure 120 comprises features that exhibit a periodicity on a nanoscale; that is, within an individual region, ordered structure 120 is maintained from about 1 nm to about 1000 nm and, more preferably, from about 10 nm to about 100 nm. In one embodiment, ordered structure 120 comprises at least one of a lamellar structure, a hexagonal structure, a cubic structure, a perforated lamellar structure, a gyroid structure, a double diamond structure, and a bicontinuous structure. The at least one ceramic phase 110 may further comprise a second, long range ordered structure having a scale ranging from about one micron to about five millimeters.

The ceramic material 100 may form a portion of a component designed for use in hot gas path assemblies, such as turbine assemblies, boilers, combustors, and the like. These components include, but are not limited to, sensors, membranes, and high strength structural components, such as nozzles, combustor liners, blades, shrouds, and the like.

The present invention also includes a method of making ceramic material 100 comprising at least one ceramic phase 110, having ordered structure 120 on a nanoscale, as described hereinabove. First, at least one polymeric precursor for the at least one ceramic phase 110 and at least one block copolymer (also referred to hereinafter as "BCP") such as, but not limited to, di-block copolymers, tri-block copolymers, linear BCPs, branch BCPs, star block copolymers, and the like are provided. The at least one polymeric precursor may be either a liquid or solid primary polymer precursor. Non-limiting examples of such polymeric precursors include polysilazane, polycarbosilane, polyboroncarbosilane, polyborocarbosilazane, polyborazylene, and the like. In one embodiment, the at least one polymeric precursor is dissolved in at least one organic solvent, such as, but not limited to, tetrahydrofuran (also referred to hereinafter as "THF"), chloroform, hexane, benzene, toluene, and combinations thereof to form a first solution. The resulting first solution comprises from about 0.1 weight percent to about 10 weight percent of the at least one polymeric precursor. In one particular embodiment, the first solution contains from about 0.5 weight percent to about 5 weight percent of the at least one polymeric precursor. In one embodiment, the first solution comprises the at least one polymeric precursor and at least one free radical initiator. The at least one free radical initiator generates free radicals and helps initiate cross-linking of the at least one precursor. Such cross-linking helps preserve the ordered structure at temperatures greater than the order-disorder transition (ODT) temperature of the BCP. The free radical initiator is preferably an organic peroxide, such as, but not limited to, cumyl peroxides and the like. Other free radical initiators that may be used include, but are not limited to, alkoxyamines and dithioesters. The free radical initiator is added to the precursor prior to dissolution into the organic solvent, and is present in a range up to about 10% and, preferably, is present in a range from about 0.5 to about 5% with respect to the weight of the polymer precursor.

The at least one block copolymer comprises a diblock amphiphilic block copolymer. Non-limiting examples such block copolymers include: butadienes, such as a poly(butadiene)-b-poly(ethylene oxide) polymer (also referred to hereinafter as "PB-b-PEO"); polyisoprene; polydimethylsiloxane; polystyrene; polyvinylpyridene; polyethylene; polypropylene; polypropylene oxide; polyethylene propylene; polyacrylates; polymethacrylates; polylactides; polyacrylonitrile; and the like. A second solution is prepared by dissolving the at least one block copolymer, which has a controlled molecular weight and polydispersity, into the same organic solvent as that chosen for the solution of the polymer precursor. The second solution comprises from about 0.5 weight percent to about 5 weight percent of the at least one block copolymer in the organic solvent.

A homogenized mixture comprising the at least one polymeric precursor and the at least one block copolymer is then formed. In one embodiment, the first solution containing the at least one polymeric precursor and the second solution containing the at least one block copolymer are homogenized by mixing the two solutions and stirring the combined solution for a time period ranging from about two hours to about 12 hours. After mixing, the combined solution is cast into a dish and allowed to dry for a time period ranging from about 4 hours to about 24 hours to produce a dried mixture.

Alternatively, the step of forming a homogenized mixture of the at least one polymeric precursor and the at least one block copolymer may be carried out in the absence of solvent. In this embodiment, the step of forming a homogenized mixture comprises melt mixing of the at least one polymeric precursor, the at least one block copolymer, and a free radical initiator. The melt mixing is carried out at a temperature in a range that is between the lowest glass transition temperature of the at least one block copolymer and the decomposition temperature of the at least one block copolymer.

An ordered structure is then formed by curing the at least one polymeric precursor and self-assembly of the at least one block copolymer. In one embodiment, the dried mixture described above is vacuum annealed to remove any residual solvent. Curing of the at least one polymeric precursor and self-assembly of the block copolymer occurs in this annealing stage. After annealing, the dried mixture assumes a state ranging from rubber-like to a solid glass-like form. In one embodiment, the at least one polymeric precursor is completely cured. Alternatively, the at least one polymeric precursor undergoes partial curing during the annealing step.

During the annealing step, the at least one polymeric precursor cross-links to form a structure robust enough to survive the pyrolysis process and the order-disorder transition (ODT) temperature of the block copolymer. Voids left behind by the decomposition of block copolymer can be closed during pyrolysis, leading to a nonporous, dense material. In one embodiment, ceramic material 100 has a porosity of less than about 30 percent.

Within the homogenized mixture, the ratio of the weight of the at least one polymeric precursor to the weight of the block copolymer is in a range from about 95:5 to about 5:95. Depending on the chemical structure of the block copolymer and the ratio of the at least one polymeric precursor to the block copolymer, different ordered structures and morphologies such as, but not limited to, lamellar, hexagonal, cubic, perforated lamellar, gyroid, double gyroid, double diamond, and other bicontinuous phases can be obtained. Changes in nanocomposite morphology observed with changes in the ratio of BCP to precursor are shown in FIGS. 2, 3, 4, and 5, which are TEM images of (PB-b-PEO)/polysilazane blends having BCP:precursor ratios of 63:37 (FIG. 2), 56:44 (FIG. 3), 38:62 (FIG. 4), and 17:83 (FIG. 5) by weight, respectively, after self-assembly at 100° C. for 12 hours. At low polymeric precursor concentrations (i.e., at high values of the BCP:precursor ratio), the polysilazane precursor exhibits a cylindrical morphology 210, shown in FIG. 2. As the concentration of the polysilazane precursor increases, the nanocomposite morphology shifts to a lamellar structure 220, shown in FIG. 3. A further increase in the polysilazane precursor concentration yields a more pronounced lamellar structure 220, shown in FIG. 4. Higher polysilazane precursor concentrations yield a gyroid structure 230, shown in FIG. 5, or a bi-continuous structure.

The mixture of cured (or partially cured) polymeric precursor and self-assembled block copolymer is then pyrolyzed to decompose at least a portion of the block copolymer. The self-assembled structure of the block copolymer is fixed by cross-linking of the at least one polymeric precursor so that an ordered structure is retained at temperatures above the order-disorder transition (also referred to herein as "ODT") of the block copolymer. In one embodiment, the step of pyrolyzing the at least one polymeric precursor and the at least one block copolymer comprises heating the cross-linked polymer mixture at a heating rate in a range from about 1° C./min to about 20° C./min, then dwelling at a final annealing temperature in a range from about 800° C. to about 1500° C. for a time period ranging from about 1 hour to about 4 hours. The C/Si—C—N(—O) nanocomposite shown in FIG. 1 is a product of pyrolysis at 800° C. of a self-assembled PB-b-PEO/polysilazane blend for 1 hour, and has a BCP:precursor ratio of 56:44 by weight.

After pyrolysis, the at least one polymeric precursor is converted to form the at least one ceramic phase 110 having ordered structure 120. Typically, the conversion is carried out at a predetermined temperature in a range from about 800° C. to about 1500° C., in the presence of at least one reactive gas, such as, for example, ammonia, nitrogen, combinations thereof, and the like. The actual conditions under which conversion takes place depend on the particular polymeric precursor (or precursors) and reactive gases that are used. For example, the polymeric precursor polysilazane is converted to amorphous silicon nitride by converting the precursor in the presence of ammonia, whereas in another embodiment, silicon carbonitride is obtained by reacting polysilazane with nitrogen gas. In a third embodiment, silicon carbide is obtained by converting polysilazane in inert gas. Similarly, polyborocarbosilazane is converted into silicon boron carbonitride, and polyborazylene is converted into either boron carbonitride or boron nitride, depending upon the atmosphere under which conversion is performed.

The block copolymer leaves behind a carbon residue, and possibly oxygen from the poly(ethylene oxide) (also referred to herein as "PEO") phase. The present invention employs localized viscous flow of the precursor under the driving force of surface tension. This leads to elimination of voids left behind by the decomposition of block copolymer. In addition, the carbon residue from the block copolymer prevents the formation of a featureless monolith of ceramic. As a result of eliminating voids and the presence of residual carbon, a lamellar nanocomposite that inherits the structural feature of the self-assembled polymer is successfully obtained. This differs from structures formed by lamellar oxides that are templated by block copolymers. Such structures tend to fragment into isolated lamellae upon the removal of the block copolymer.

The present invention also provides a method of making an article, such as the components designed for use in hot gas path assemblies, comprising the ceramic materials previously described herein. At least one polymeric precursor for the at least one ceramic phase and at least one block copolymer are provided and formed into a homogenized mixture according to the methods described hereinabove. In some embodiments, as previously described, the homogenized mixture further includes a free radical initiator. The homogenized mixture is then cast into a preform of the article. As detailed above, the at least one polymeric precursor is cured and the at least one block copolymer undergoes self-assembly. Curing and self-assembly are carried out within the preform. The preform is then pyrolyzed to decompose at least a portion of the at least one block copolymer. The at least one polymeric precursor in the preform is then converted to form a near net shape of the article comprising at least one ceramic phase having an ordered structure.

Conditions for self-assembly of the block copolymer and curing and converting the at least one polymeric precursor are the same as those previously described herein for the method of making the ceramic material.

In one embodiment, the preform is molded into a shape. Alternatively, the preform may be shaped, cast, or formed using methods that are known in the art. The preform is a sheet shaped by a flat substrate, may be stacked by rolling and pressing, or may be formed by infiltration into a porous matrix comprising, for example, a plurality of woven ceramic fibers comprising carbon fibers, boron nitride fibers, silicon carbide fibers, and the like.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A ceramic material, said ceramic material being nonporous and comprising at least one ceramic phase, wherein said at least one ceramic phase has an ordered structure on a nanoscale, and wherein said ordered structure is thermally stable up to a temperature of at least about 800° C.

2. The ceramic material according to claim 1, wherein said at least one ceramic phase comprises one of an oxide, a carbide, a nitride, a boride, and combinations thereof.

3. The ceramic material according to claim 2, wherein said at least one ceramic phase comprises at least one of silicon carbide, silicon nitride, silicon carbonitride, silicon oxynitride, silicon boron carbonitride, boron nitride, boron carbide, boron carbonitride, and combinations thereof.

4. The ceramic material according to claim 1, wherein said ordered structure comprises at least one of a lamellar structure, a perforated lamellar structure, a hexagonal structure, a cubic structure, a gyroid structure, a double gyroid structure, a double diamond structure, and a bi-continuous structure.

5. The ceramic material according to claim 1, wherein said ordered structure has a periodicity that extends over a scale ranging from about 1 nm to about 1000 nm.

6. The ceramic material according to claim 5, wherein said ordered structure has a periodicity that extends over a scale ranging from about 10 nm to about 100 nm.

7. The ceramic material according to claim 1, further comprising a second ordered structure, said second ordered structure having a scale ranging from about one micron to about five millimeters.

8. The ceramic material according to claim 1, wherein said ceramic material forms a portion of a hot gas path assembly component.

9. The ceramic material according to claim 1, wherein said ordered structure is formed by: combining at least one polymeric precursor for said at least one ceramic phase and at least one block copolymer; ordering said at least one polymeric precursor and said at least one block copolymer; and pyrolyzing said at least one polymeric precursor and said at least one block copolymer to form said at least one ceramic phase.

10. The ceramic material according to claim 1, wherein said ordered structure is thermally stable up to a temperature in a range from about 800° C. to about 1800° C.

11. The ceramic material according to claim 10, wherein said ordered structure is thermally stable up to a temperature in a range from about 1200° C. to about 1500° C.

12. A ceramic material, said ceramic material being nonporous and comprising at least one ceramic phase, wherein said at least one ceramic phase has an ordered structure on a nanoscale, and wherein said ordered structure is thermally stable up to a temperature of at least about 800° C. and wherein said ceramic material is formed by:
   a) forming a homogenized mixture of at least one polymeric precursor of said at least one ceramic phase and at least one block copolymer;
   (b) forming said ordered structure by curing said at least one polymeric precursor and self-assembly of said at least one block copolymer;
   c) pyrolyzing said at least one polymeric precursor and said at least one block copolymer to decompose at least a portion of said block copolymer; and
   d) converting said at least one polymeric precursor to form said at least one ceramic phase, said at least one ceramic phase having an ordered structure.

13. The ceramic material according to claim 12, wherein said at least one ceramic phase comprises one of an oxide, a carbide, a nitride, a boride, and combinations thereof.

14. The ceramic material according to claim 13, wherein said at least one ceramic phase comprises at least one of silicon carbide, silicon nitride, silicon carbonitride, silicon oxynitride, silicon boron carbonitride, boron nitride, boron carbide, boron carbonitride, and combinations thereof.

15. The ceramic material according to claim 12, wherein said ordered structure comprises at least one of a lamellar structure, a hexagonal structure, a cubic structure, a perforated lamellar structure, a gyroid structure, a double diamond structure, and a bicontinuous structure.

16. The ceramic material according to claim 12, wherein said ordered structure has a periodicity that extends over a scale ranging from about 1 nm to about 1000 nm.

17. The ceramic material according to claim 16, wherein said ordered structure has a periodicity that extends over a scale ranging from about 10 nm to about 100 nm.

18. The ceramic material according to claim 12, further comprising a second ordered structure, said second ordered structure having a scale ranging from about one micron to about five millimeters.

19. The ceramic material according to claim 12, wherein said ordered structure is thermally stable up to a temperature in a range from about 800° C. to about 1800° C.

20. The ceramic material according to claim 19, wherein said ordered structure is thermally stable up to a temperature in a range from about 1200° C. to about 1500° C.

21. A ceramic material, said ceramic material being nonporous and comprising at least one ceramic phase, wherein said at least one ceramic phase comprises one of an oxide, a carbide, a nitride, a boride, and combinations thereof, and has an ordered structure on a nanoscale, wherein said ordered structure is thermally stable up to a temperature of at least about 800° C., and wherein said at least one ceramic phase is formed by:
   a) forming a homogenized mixture of at least one polymeric precursor of said at least one ceramic phase and at least one block copolymer;
   b) forming said ordered structure by curing said at least one polymeric precursor and self-assembly of said at least one block copolymer;
   c) pyrolyzing said at least one polymeric precursor and said at least one block copolymer to remove said at least one block copolymer; and
   d) converting said at least one polymeric precursor to form said at least one ceramic phase, said at least one ceramic phase having an ordered structure.

22. The ceramic material according to claim 21, wherein said at least one ceramic phase comprises at least one of silicon carbide, silicon nitride, silicon carbonitride, silicon oxynitride, silicon boron carbonitride, boron nitride, boron carbide, boron carbonitride, and combinations thereof.

23. The ceramic material according to claim 21, wherein said ordered structure comprises at least one of a lamellar structure, a hexagonal structure, and a cubic structure, a perforated lamellar structure, a gyroid structure, a double diamond structure, and a bicontinuous structure.

24. The ceramic material according to claim 21, wherein said ordered structure has a periodicity chat extends over a scale ranging from about 1 nm to about 1000 nm.

25. The ceramic material according to claim 24, wherein said ordered structure has a periodicity that extends over a scale ranging from about 10 nm to about 100 nm.

26. The ceramic material according to claim 21, further comprising a second ordered structure, said second ordered structure having a scale ranging from about one micron to about five millimeters.

27. The ceramic material according to claim 21, wherein said ceramic material forms a portion of a high strength structural component.

28. The ceramic material according to claim 21, wherein said ceramic material forms a portion of a hot gas path assembly component.

* * * * *